United States Patent [19]
Tanabe

[11] Patent Number: 5,434,647
[45] Date of Patent: Jul. 18, 1995

[54] PROJECTOR FOR EXPOSING PHOTOSENSITIVE SUBSTRATE

[75] Inventor: Hiroyoshi Tanabe, Tokyo, Japan
[73] Assignee: NEC Corporation, Tokyo, Japan
[21] Appl. No.: 229,833
[22] Filed: Apr. 19, 1994
[30] Foreign Application Priority Data
  May 14, 1993 [JP] Japan .................. 5-112557
[51] Int. Cl.⁶ .............................. G03B 27/42
[52] U.S. Cl. .......................... 355/53; 355/71; 430/5
[58] Field of Search ............ 355/53, 67, 71; 430/5
[56] References Cited

U.S. PATENT DOCUMENTS

| | | | |
|---|---|---|---|
| 5,144,362 | 9/1992 | Kamon et al. | 355/53 |
| 5,264,898 | 11/1993 | Kamon et al. | 355/67 |
| 5,305,054 | 4/1994 | Suzuki et al. | 355/53 |
| 5,335,044 | 8/1994 | Shiraishi | 355/53 |
| 5,345,292 | 9/1994 | Shiozawa et al. | 355/67 |
| 5,348,837 | 9/1994 | Fukuda et al. | 355/53 X |

*Primary Examiner*—Michael L. Gellner
*Assistant Examiner*—D. P. Malley
*Attorney, Agent, or Firm*—Young & Thompson

[57] ABSTRACT

A projector for exposing a photosensitive substrate includes a mask having an exposure pattern thereon composed of half-transparent material which causes a phase difference among lights passing therethrough, a first optical system for illuminating the mask, a second optical system for projecting the exposure pattern on the photosensitive substrate, and a device, disposed ahead of the first optical system, for controlling a quantity of illumination light to be irradiated in a plurality of areas of the first optical system.

7 Claims, 5 Drawing Sheets

PROJECTOR FOR EXPOSING PHOTOSENSITIVE SUBSTRATE

BACKGROUND OF THE INVENTION

1. Field of the Invention

The invention relates to a projector for exposing a photosensitive substrate, suitable for use when a circuit pattern is to be transferred in fabricating a semiconductor integrated circuit.

2. Description of the Related Art

A projector for exposing a photosensitive substrate is required to have high productivity in processing micro patterns for a semiconductor integrated circuit. When a circuit pattern is to be fabricated on a semiconductor, a photolithography technology is generally used for transferring a pattern formed on a mask onto a substrate. In the photolithography, a mask on which a desired pattern is formed is irradiated with exposure light such as ultra violet ray, and thereby images of the pattern are projected through a projection optical system onto a photosensitive resist layer formed on a substrate. The resolution and depth of focus of a projector is dependent on a number of apertures (hereinafter referred to as "NA") and a wavelength of exposure light. A larger number of apertures (NA) and/or a shorter wavelength of exposure light enhance resolution of a projector, but decrease depth of focus.

One of exposure methods for increasing or deepening depth of focus while preventing a resolution of a projector from deteriorating has been suggested in Japanese Patent Public Disclosure No. 4-136854 published on May 11, 1992. This Disclosure sets forth a phase shifting method in which a mask has an exposure pattern composed of half-transparent material which causes phase differences among lights passing therethrough. The phase shifting method utilizes diffraction of light for enhancing a resolution of an optical system for projection, and includes a phase shifter, namely a dielectric substance for inverting a phase of exposure light every other light-pervious pattern through which the exposure light passes.

Another method for increasing depth of focus has been suggested in Japanese Patent Public Disclosure No. 4-180612 published on Jun. 26, 1992. This Disclosure sets forth a device for dividing a light flux, disposed in an optical path of an optical system for illumination. Hereinafter this method is referred to as a light flux dividing method.

The above-mentioned phase shifting method can enhance depth of focus of an isolated pattern in which adjacent apertures are spaced far from each other, but decreases the contrast of optical images and thereby disables resolution of a projector in a pattern in which adjacent apertures are relatively close to each other. Thus, the phase shifting method is useful only for an isolated pattern and hence has been used only for contact hole exposure. Conventionally, in a mask including contact holes, since adjacent holes are spaced apart from each other by a distance more than double hole diameter, such contact holes can be deemed to constitute an isolated pattern. However, the necessity of a mask as disclosed in FIG. 6 has recently increased for enhancing integration of a semiconductor integrated circuit. The mask illustrated in FIG. 6 comprises a glass substrate 4 and an exposure pattern 5 formed on the substrate 4. The pattern 5 includes both an isolated pattern 9 and an arranged pattern 10 in which a distance between adjacent holes is smaller than double hole diameter. If the depth of focus of the isolated pattern 9 is intended to increase by means of the abovementioned phase shifting method, there arises a problem that the arranged pattern 10 cannot be resolved.

FIG. 7 illustrates another mask pattern comprising an isolated line pattern 11 and an arranged line pattern 12. There would arise the same problem as that aforementioned with reference to FIG. 6, if the depth of focus of the isolated pattern 11 is intended to increase by means of the phase shifting method.

The light flux dividing method disclosed in Japanese Public Disclosure No. 4-180612 could increase the depth of focus of the arranged patterns 10 and 12, but could not increase the depth of focus of the isolated patterns 9 and 11. Thus, the light flux dividing method could not increase the depth of focus of all the patterns 9, 10, 11 and 12 formed on the masks as illustrated in FIGS. 6 and 7.

SUMMARY OF THE INVENTION

It is an object of the present invention to provide a projector for exposing a photosensitive substrate, which can enhance the depth of focus of all patterns included in a mask, even if the mask has both an isolated pattern and an arranged pattern.

The invention provides a projector for exposing a photosensitive substrate, including a mask having an exposure pattern thereon composed of half-transparent material which causes a phase difference among lights passing therethrough, a first optical system for illuminating the mask with light provided from a light source, a second optical system for projecting the exposure pattern on the photosensitive substrate, and a control device disposed ahead of the first optical system for controlling a quantity of illumination light to be irradiated in a plurality of areas of the first optical system.

In a preferred embodiment, the first optical system has first and second areas to which the illumination light is to be irradiated. A quantity of illumination light to be irradiated to the first area is smaller than a quantity of illumination light to be irradiated to the second area.

In another preferred embodiment, the first area corresponds to central portion of a flux of the illumination light.

In still another preferred embodiment, a quantity of illumination light to be irradiated to the first area is zero (0).

In yet another preferred embodiment, the control device comprises a plate for interrupting passage of light.

In still yet another preferred embodiment, the plate includes a light-impervious area and a light-pervious area.

In a further preferred embodiment, the light-impervious area corresponds to a central area of the plate.

In still a further preferred embodiment, the plate comprises a central circular portion and an annular portion disposed coaxially with the central circular portion. These portions interrupt light to pass therethrough.

In still a further preferred embodiment, the control device is detachable or interchangeable.

In still a further preferred embodiment, the control device comprises a moving or oscillating reflection mirror or prism.

The invention also provides a projector for exposing a photosensitive substrate, including a mask having an exposure pattern thereon composed of half-transparent material which causes a phase difference among lights passing therethrough, a first optical system for illuminating the mask with light provided from a light source, a second optical system for projecting the exposure pattern on the photosensitive substrate, and a control device disposed ahead of the first optical system for forming on the first optical system a first area on which the illumination light is not irradiated and a second area on which the illumination area is irradiated.

The invention further provides a projector for exposing a photosensitive substrate, including a mask having an exposure pattern thereon composed of half-transparent material which causes a phase difference among lights passing therethrough, the pattern including an isolated pattern and an arranged pattern, a first optical system for illuminating the mask with light provided from a light source, a second optical system for projecting the exposure pattern on the photosensitive substrate, and a control device disposed ahead of the first optical system for controlling a quantity of illumination light to be irradiated in a plurality of areas of the first optical system.

In a preferred embodiment, a quantity of illumination light in central portion thereof is smaller than a quantity of illumination light around the central portion.

The invention further provides a projector for exposing a photosensitive substrate, including a mask having an exposure pattern thereon composed of half-transparent material which causes a phase difference among lights passing therethrough, the pattern including an isolated pattern and an arranged pattern, a first optical system for illuminating the mask with light provided from a light source, a second optical system for projecting the exposure pattern on the photosensitive substrate, and a device disposed ahead of the first optical system for darkening a central portion of the illumination light relative to a portion around the central portion of the illumination light.

The advantages obtained by the aforementioned present invention will be described hereinbelow.

In accordance with the invention, a central portion of flux of illumination light can be darkened. Accordingly, the depth of focus of an arranged pattern can be enhanced while the depth of focus of an isolated pattern can be also enhanced by virtue of a half tone phase shifting mask. Thus, it is possible to enhance the depth of focus of an isolated pattern and an arranged pattern both included in a common mask.

The detail is as follows. In a pattern 10 in which a plurality of holes 10a are arranged as illustrated in FIG. 2, the larger the ratio of the distance Ls between adjacent holes 10a to the size Lh of holes 10a, namely Ls/Lh, becomes, the closer the pattern 10 becomes to an isolated pattern since the influence derived from diffracted light coming from adjacent holes is weakened. In general, if the ration Ls/Lh is equal to or greater than three (3), the influence derived from diffracted light coming from adjacent holes can be disregarded. FIGS. 3 and 4 illustrate the depth of focus and the contrast respectively as a function of the ratio (Ls/Lh). The depth of focus and the contrast in FIGS. 3 and 4 are obtained by exposing the pattern 10 illustrated in FIG. 2 by means of KrF excimer laser. The number of apertures (NA) of a stepper is equal to 0.5 and a value G of a stepper is equal to 0.5. The value G means a ratio of NA of an optical system for illumination to NA of an optical system for projection. The value G is generally in the range of 0.3 to 0.6. The hole size Lh is 0.25 μm measured on a wafer. The tolerance of a resultant wafer is designed to be within 10% of design dimension. The light amplitude transmission coefficient of a phase shifting mask is 40%. A light flux of a light source is partially interrupted to travel by a plate as illustrated in FIG. 5A. The plate illustrated in FIG. 5A has a central circular portion and an annular portion disposed coaxially with the central portion. These portions are constituted of light-impervious material. The central circular portion has a diameter equal to one half of the value a.

FIG. 3 illustrates an orthogonal coordinate system having an abscissa representing the ratio Ls/Lh and an ordinate representing the depth of focus indicated with a unit of micrometer (μm). In FIG. 3, a curve 13 represents the depth of focus obtained by a conventional method, a curve 14 represents the depth of focus obtained by the half tone phase shifting method, and a curve 15 represents the depth of focus obtained by the present invention.

FIG. 4 illustrates an orthogonal coordinate system having an abscissa representing the ratio Ls/Lh and an ordinate representing the contrast. In FIG. 4, a curve 16 represents the contrast obtained by a conventional method, a curve 17 represents the contrast obtained by the half tone phase shifting method, and a curve 18 represents the contrast obtained by the present invention.

As is clearly understood in FIG. 3, the depth of focus by the phase shifting method is larger than the depth of focus by the conventional method around a point where the ratio Ls/Lh is approximately three and hence the pattern 10 approaches that of an isolated pattern. However, the depth of focus cannot be obtained in an area where the ratio Ls/Lh is below two (2), because the contrast is less than 60% in this area as illustrated in FIG. 4 and hence images cannot be resolved.

In accordance with the invention including the advantages obtained by the aforementioned phase shifting method and light flux dividing method, a depth of focus larger than 1 micrometer can be obtained in an area where the ratio Ls/Lh is in the range of about 1.2 to 3, as shown in FIG. 3. This is because the decrease of contrast occurring in an area wherein the ratio Ls/Lh is below two (2) due to the influence of a phase shifting mask can be offset with the effect of the light flux dividing method. Accordingly, the present invention can enhance the depth of focus of both an isolated pattern and an arranged pattern both included in a common mask. Thus, since it is possible to narrow the distance between adjacent holes, the integration of a semiconductor integrated circuit can be improved.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A preferred embodiment in accordance with the invention will be explained hereinbelow with reference to drawings.

Figure 1:
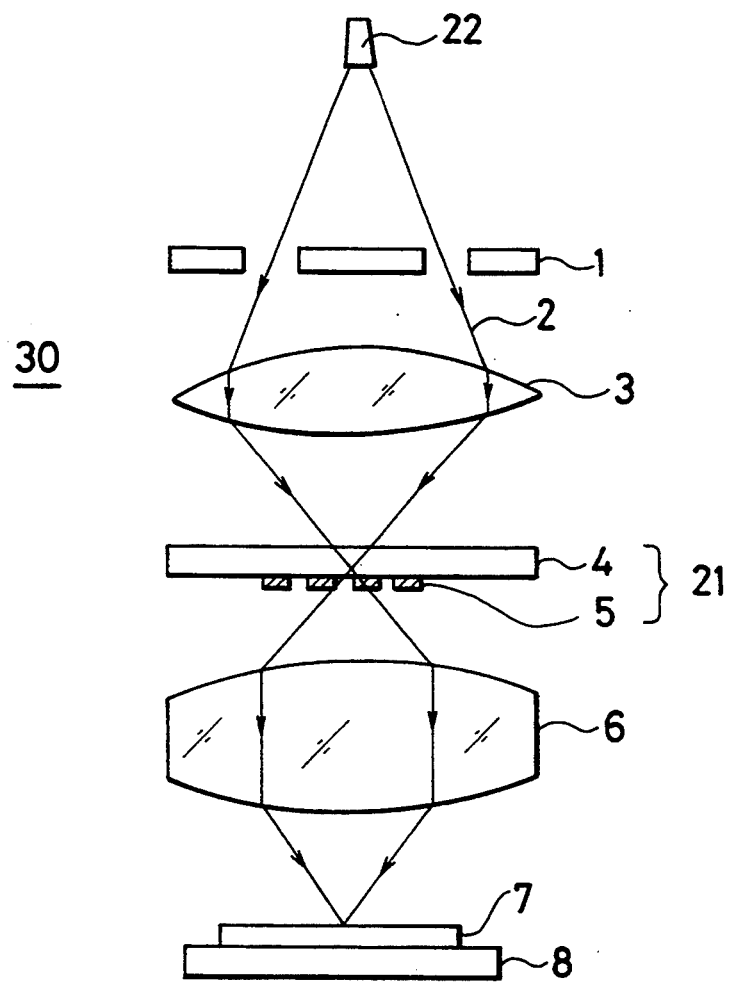
FIG. 1 is a schematic view illustrating an embodiment in accordance with the invention.
Figure 2:
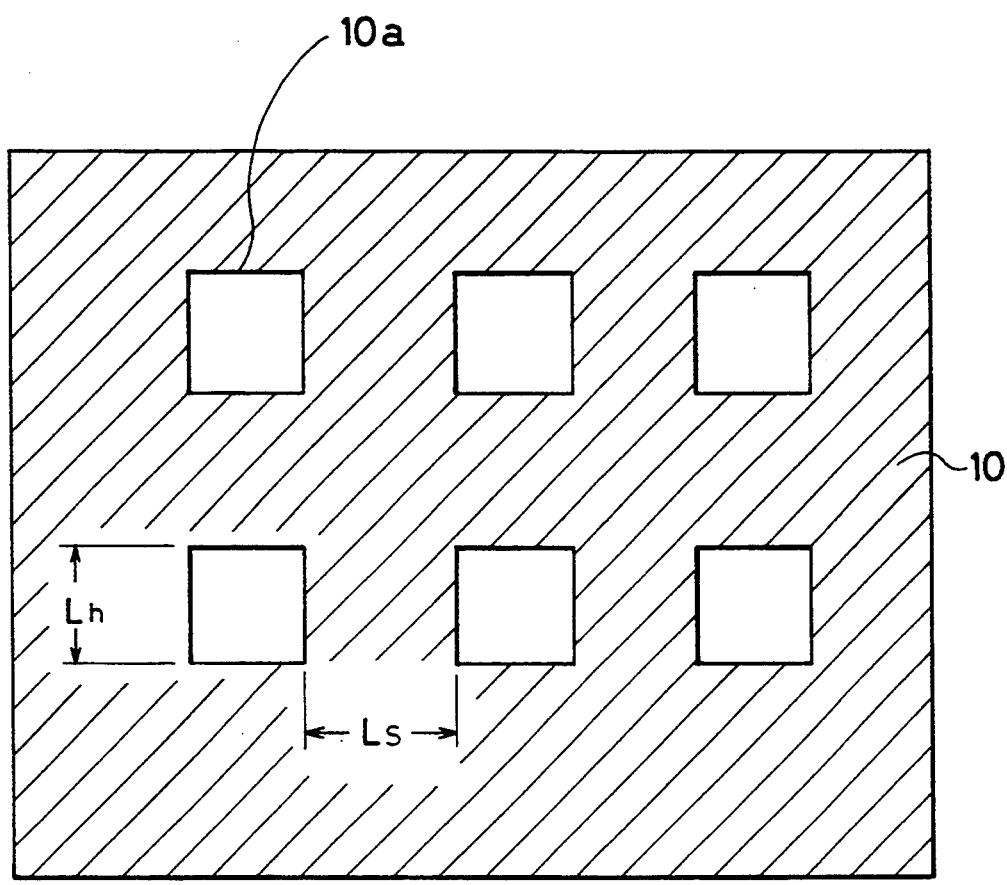
FIG. 2 illustrates a pattern of holes formed on a mask.
Figure 3:
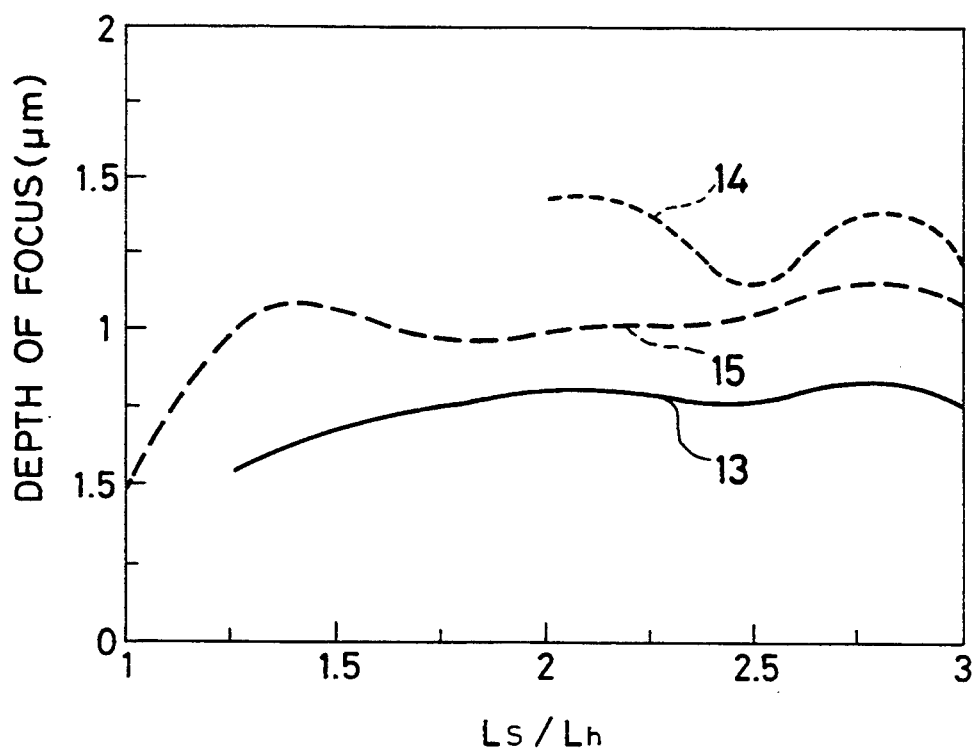
FIG. 3 are graphs illustrating the comparison of depth of focus obtained by the invention and other exposure methods.
Figure 4:
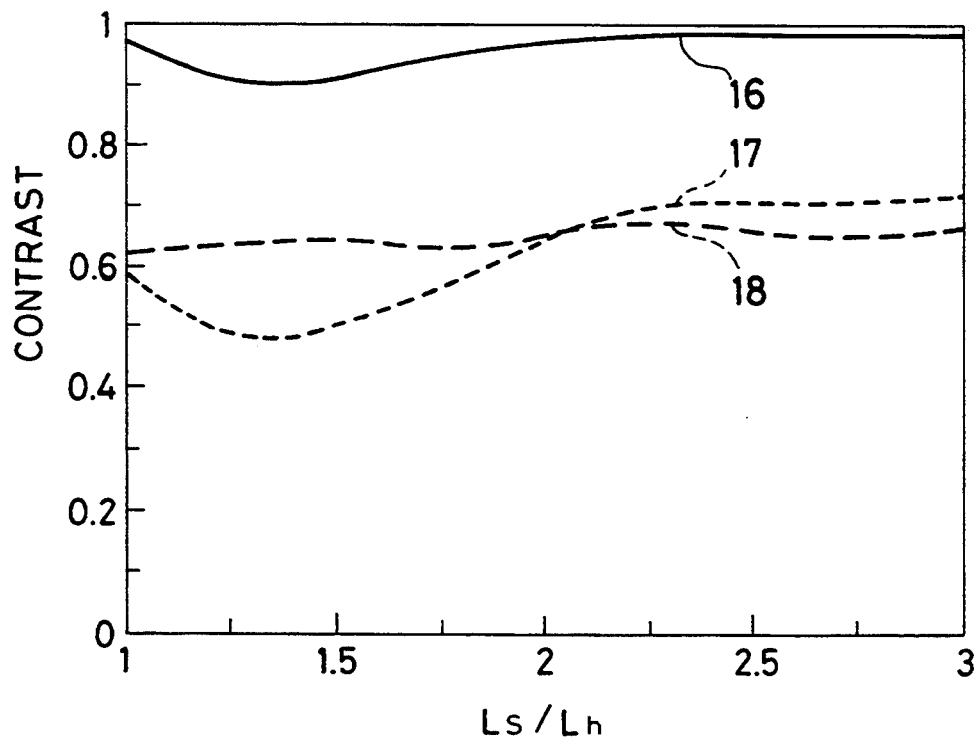
FIG. 4 are graphs illustrating the comparison of contrast obtained by the invention and other exposure methods.

FIG. 1 illustrates a projector 30 for exposing a photosensitive substance for carrying out an embodiment in accordance with the invention.

Figure 6:
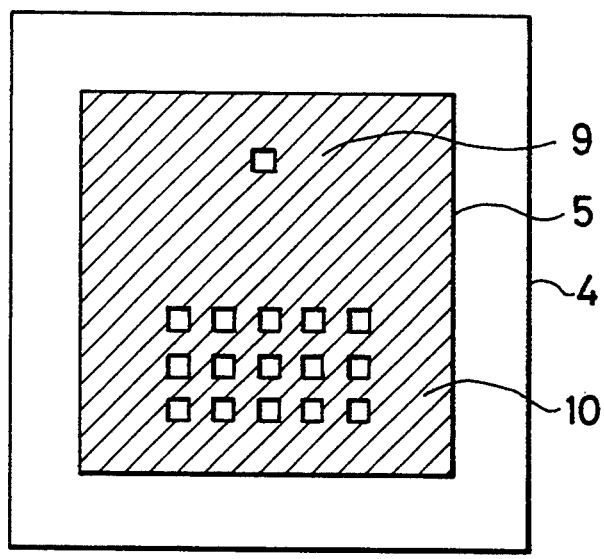
FIG. 6 is a plan view illustrating a mask including both an isolated hole pattern and an arranged hole pattern.
Figure 7:
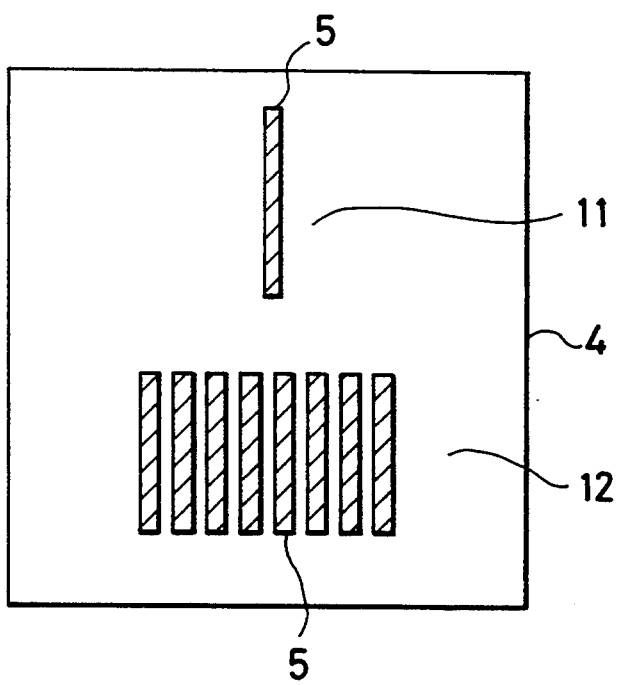
FIG. 7 is a plan view illustrating a mask including both an isolated line pattern and an arranged line pattern.

The projector 30 includes a control means 1 for interrupting a part of light flux to pass therethrough, a first optical system 3 for illumination including a lens, and a second optical system 6 for projection. A mask 21 includes a glass substrate 4 and an exposure pattern 5 disposed on the glass substrate 4 and being constituted of half-transparent film for causing a phase difference among lights passing therethrough. The exposure pattern 5 includes an isolated pattern 9 or 11, and an arranged pattern 10 or 12 as illustrated in FIGS. 6 and 7. The mask 21 is disposed between the first optical system 3 and the second optical system 6. On a stage 8 located below the second optical system 6 is disposed a wafer 7 on which a photo-resist is applied. A light source 22 constituted of KrF excimer laser is disposed above the control means 1.

Figure 5A:
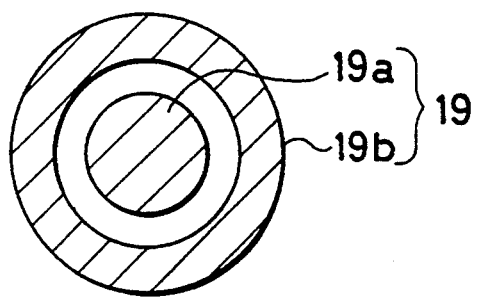
FIG. 5A is a top view of an embodiment of a plate for interrupting passage of light.
Figure 5B:
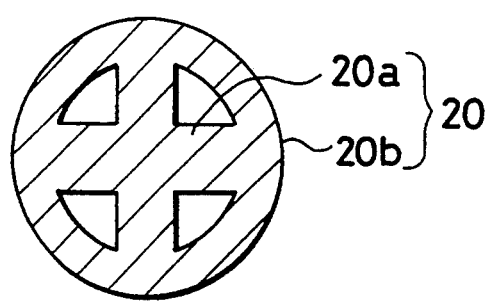
FIG. 5B is a top view of another embodiment of the plate.
Figure 5C:
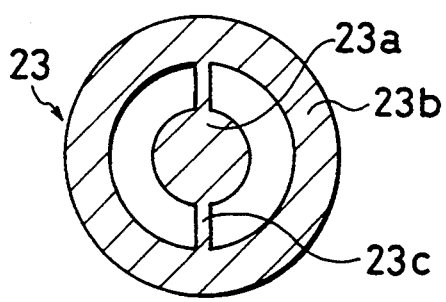
FIG. 5C is a top view of still another embodiment of the plate.
Figure 5D:
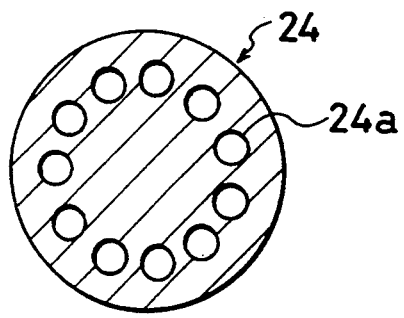
FIG. 5D is a top view of yet another embodiment of the plate.

The control means 1 comprises a plate 19 as illustrated in FIG. 5A. The plate 19 has a central circular portion 19a and an annular portion 19b disposed coaxially with the central portion 19a. The portions 19a and 19b are constituted of light-impervious material and hence interrupt the passage of light therethrough. The control means or the plate 19 is designed to be detachable, so that it can be interchanged with another type of plates as depicted in FIGS. 5B, 5C and 5D, as later described in detail.

The light emitted from the light source such as KrF excimer laser 22 is irradiated on a surface of the control means 1 or the plate 19. Since a central portion of the light flux is interrupted to pass the central portion 19a of the plate 19, the light 2 after passing the plate 19 is darkened in its central portion. Then, the light 2 passes through the first optical system 3, and irradiates the mask 21. The light transmitting through the mask 21 then passes through the second optical system 6, and is focused on the wafer 7 on which the photo-resist is applied, to thereby form an image on the wafer 7. Thus, the exposure pattern 5 is transferred on the wafer 7 in reduced dimension.

In this embodiment, KrF excimer laser is used as a light source 22, however, ArF excimer laser or i ray of highly pressured Hg lamp can be used instead.

In addition, a moving or oscillating reflection mirror or prism can be used instead of the plate 19 as the control means 1.

The plate 19 may be replaced with a plate such as illustrated in FIGS. 5B, 5C and 5D. A circular plate 20 illustrated in FIG. 5B has a cross bar portion 20a and an annular portion 20b around the cross bar portion 20a. A circular plate 23 illustrated in FIG. 5C has a central circular portion 23a, an annular portion 23b disposed coaxially with the central portion 23a, and a bar portion 23c connecting the central portion 23a to the annular portion 23b. A circular plate 24 illustrated in FIG. 5D has a plurality of circular openings 24a disposed around a center of the plate 24. These portions 20a, 20b, 23a, 23b, 23c and 24 are all constituted of light-impervious material and hence interrupt the passage of light therethrough. Accordingly, the plates 20, 23 and 24 can darken the light flux emitted from the light source 22 only in its central portion similarly to the plate 19.

In this embodiment, the control means 1 can be modified. For instance, a film of which the control means 1 or the plate 19 is constituted may be replaced with a film having a light transmission ratio in the range of 0 to 100. The plate 19 corresponds to a light transmission ratio of zero (0). Since the control means 1 or the plate 19 is designed to be interchangeable as aforementioned, a quantity of illumination light to be irradiated in areas of the first optical system 3 can be desirably controlled by changing the plate 19 having a desired light transmission ratio. In a similar fashion, the quantity of illumination light to be irradiated to a central portion of the first optical system 6 can be smaller than a quantity of illumination light to be irradiated to a portion of the first optical system 6 around the central portion thereof. As is clearly understood, if a quantity of illumination light to be irradiated to a central portion of the first optical system 6 is adjusted to be zero (0), it corresponds to the aforementioned embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A projector for exposing a photosensitive substrate, comprising:
   a mask having an exposure pattern thereon composed of half-transparent material which cause a phase difference among lights passing therethrough, said pattern including an isolated pattern and an arranged pattern;
   a first optical system for illuminating said mask with light provided from a light source;
   a second optical system for projecting said exposure pattern on the photosensitive substrate; and
   control means, disposed between the light source and said first optical system, for controlling a quantity of illumination light to be irradiated in a plurality of areas of said first optical system.

2. A projector in accordance with claim 1, wherein the quantity of illumination light to be irradiated in a central portion of the first optical system is smaller than the quantity of illumination light to be irradiated around said central portion.

3. A projector in accordance with claim 2, wherein said quantity of illumination light to be irradiated in the central portion is zero (0).

4. A projector in accordance with claim 1, wherein said control means comprise a plate for interrupting passage of light, said plate including a central circular portion and an annular portion disposed coaxially with the central circular portion, said portions interrupting light from passing therethrough.

5. A projector in accordance with claim 1, wherein said control means is detachable or interchangeable.

6. A projector in accordance with claim 1, wherein said control means comprise a moving or oscillating reflection mirror or prism.

7. A projector for exposing a photosensitive substrate, comprising:
a mask having an exposure pattern thereon composed of half-transparent material which causes a phase difference among lights passing therethrough, said pattern including an isolated pattern and an arranged pattern;
a first optical system for illuminating said mask with light provided from a light source;
a second optical system for projecting said exposure pattern on the photosensitive substrate; and
means, disposed between the light source and said first optical system, for darkening a central portion of the illumination light relative to a portion around said central portion of the illumination light.

* * * * *